(12) United States Patent
Ahn et al.

(10) Patent No.: US 7,351,915 B2
(45) Date of Patent: Apr. 1, 2008

(54) PRINTED CIRCUIT BOARD INCLUDING EMBEDDED CAPACITOR HAVING HIGH DIELECTRIC CONSTANT AND METHOD OF FABRICATING SAME

(75) Inventors: Jin-Yong Ahn, Daejeon (KR); Chang-Sup Ryu, Daejeon (KR); Suk-Hyeon Cho, Daejeon (KR); Seok-Kyu Lee, Chungcheongbuk-do (KR); Jong-Kuk Hong, Chungcheongnam-do (KR); Ho-Sik Jun, Chungcheongbuk-do (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 353 days.

(21) Appl. No.: 10/999,442

(22) Filed: Nov. 29, 2004

(65) Prior Publication Data

US 2006/0044734 A1    Mar. 2, 2006

(30) Foreign Application Priority Data

Aug. 26, 2004    (KR) .................. 10-2004-0067487

(51) Int. Cl.
*H05K 1/16*    (2006.01)

(52) U.S. Cl. ........................ 174/260; 361/792

(58) Field of Classification Search ........... 174/260; 361/761–764
See application file for complete search history.

(56) References Cited

U.S. PATENT DOCUMENTS

| 5,079,069 | A |  | 1/1992 | Howard et al. |
| 5,261,153 | A |  | 11/1993 | Lucas |
| 5,800,575 | A |  | 9/1998 | Lucas |
| 6,274,224 | B1 |  | 8/2001 | O'Bryan et al. |
| 6,349,456 | B1 |  | 2/2002 | Dunn et al. |
| 6,395,996 | B1 | * | 5/2002 | Tsai et al. ............. 174/260 |
| 6,407,929 | B1 | * | 6/2002 | Hale et al. ............ 361/763 |
| 2006/0002097 | A1 | * | 1/2006 | Borland et al. ........ 361/763 |

FOREIGN PATENT DOCUMENTS

| JP | 56-50505 | 5/1981 |
| JP | 60-62186 | 4/1985 |
| JP | 1-225304 | 9/1989 |
| JP | 9-237969 | 9/1997 |
| JP | 2003-243795 | 8/2003 |
| WO | 2004/056160 | 7/2004 |

* cited by examiner

*Primary Examiner*—Jeremy C Norris
(74) *Attorney, Agent, or Firm*—Darby & Darby, P.C.

(57) ABSTRACT

A printed circuit board (PCB) having at least one embedded capacitor and a method of fabricating the same is provided. A dielectric layer is formed using a ceramic material having a high capacitance, thereby assuring that the capacitors each have a high dielectric constant corresponding to the capacitance of a decoupling chip capacitor.

8 Claims, 15 Drawing Sheets

PRINTED CIRCUIT BOARD INCLUDING EMBEDDED CAPACITOR HAVING HIGH DIELECTRIC CONSTANT AND METHOD OF FABRICATING SAME

BACKGROUND OF THE INVENTION

INCORPORATION BY REFERENCE

The present application claims priority under 35 U.S.C. § 119 to Korean Patent Application No. 2004-67487 filed on Aug. 26, 2004. The content of the application is incorporated herein by reference in its entirety.

1. Field of the Invention

The present invention relates, in general, to a printed circuit board (PCB) including embedded capacitors and a method of fabricating the same and, more particularly, to a PCB including embedded capacitors, in which a dielectric layer is formed using a ceramic material having a high capacitance, thereby assuring that the capacitors each have a high dielectric constant corresponding to the capacitance of a decoupling chip capacitor, and a method of fabricating the same.

2. Description of the Prior Art

Typically, discrete chip resistors or discrete chip capacitors have been frequently mounted on most printed circuit boards (PCB), but, recently, PCBs are developing in which passive components, such as resistors or capacitors, are embedded.

A technology for fabricating the PCBs including the passive components embedded therein, achieves substitution of conventional chip resistors or chip capacitors by mounting the passive components, such as the resistors or capacitors, on an external surface of a PCB or in an internal layer of the PCB according to a novel process employing a novel material (substance). In other words, the PCB including the passive component embedded therein has a structure in which the passive component, for example, the capacitor, is embedded in the internal layer of the PCB or mounted on the external surface of the PCB, and if the capacitor as the passive component is integrated with the PCB to act as one part of the PCB regardless of the size of a substrate, the capacitor is called an "embedded capacitor" and the resulting PCB is called "PCB including embedded capacitor". One of the most important features of the PCB including the capacitor embedded therein is that since the capacitor is already mounted as part of the PCB in the PCB, it is not necessary to mount the capacitor on a surface of the PCB.

On the whole, the technology of fabricating a PCB including a capacitor embedded therein may be classified into three methods, and a description will be given of the three methods, below.

Firstly, there is a method of fabricating a polymer thick film type of capacitor, in which application of a polymer capacitor paste and thermal hardening, that is, drying, are conducted to fabricate a capacitor. In the above method, after the polymer capacitor paste is applied on an internal layer of a PCB and dried, a copper paste is printed on the resulting PCB and dried so that electrodes are formed, thereby making an embedded capacitor.

A second method is to apply a ceramic filled photosensitive resin on a PCB to fabricate a discrete type of embedded capacitor, and Motorola Inc. in USA holds a patent for related technologies. In detail, the photosensitive resin containing ceramic powder is applied on the PCB, a copper foil is laminated on the resulting PCB to form upper and lower electrodes, a circuit pattern is formed, and the photosensitive resin is etched to fabricate the discrete type of capacitor.

A third method is to insert an additional dielectric layer having a capacitance characteristic in an internal layer of a PCB so as to substitute for a decoupling capacitor conventionally mounted on a surface of a PCB, thereby fabricating a capacitor, and Sanmina Corp. in USA holds a patent for related technologies. According to the third method, the dielectric layer including a power supply electrode and a grounded electrode is inserted into the internal layer of the PCB to fabricate a power distribution type of decoupling capacitor.

The above three methods have been achieved through various processes, and each process is realized in a different manner. However, a market for PCBs including embedded capacitors is not yet activated. Accordingly, standardization of the above methods has not been achieved yet, but commercialization of the methods is under development.

Hereinafter, a detailed description will be given of a conventional PCB including an embedded capacitor and a method of fabricating the same, referring to the drawings.

Firstly, a conventional technology of FIGS. 1a to 1e will be described, below.

FIGS. 1a to 1e illustrate the production of the conventional PCB including the polymer thick film type of embedded capacitors. A polymer capacitor paste is applied and heat-dried (or hardened) to create the PCB including the polymer thick film type of embedded capacitors.

In a first step, a dry film is applied on copper foils of an internal layer 42, made of FR-4, of the PCB, exposed and developed, and the resulting copper foils are etched to form copper foils 44a, 44b for a positive electrode (+), copper foils 43a, 43b for a negative electrode (−), and clearances (refer to FIG. 1a).

In a second step, capacitor pastes 45a, 45b, which are made of a polymer containing ceramic powder having a high dielectric constant, are applied on the copper foils 43a, 43b for the negative electrode (−) using a screen printing technology, and then dried or hardened (refer to FIG. 1b). In this regard, the screen printing technology is a method of passing a medium, such as an ink, through a stencil screen using a squeeze to transcribe a pattern to the surface of a substrate.

At this time, the capacitor pastes 45a, 45b are packed into the clearances between the copper foils 44a, 44b for the positive electrode (+) and the copper foils 43a, 43b for the negative electrode (−).

In a third step, positive electrodes (+) 46a, 46b are formed using a conductive paste, such as silver or copper, according to a screen printing technology, dried and hardened (refer to FIG. 1c).

In a fourth step, capacitor layers formed on the internal layer 42 of the PCB according to the first to third steps are interposed between insulating layers 47a, 47b, and subjected to a lamination process (refer to FIG. 1d).

In a fifth step, capacitors on the internal layer of the PCB are connected to positive terminals (+) 51a, 51b and negative terminals (−) 50a, 50b of integrated circuit chips (IC chip) 52a, 52b, mounted on an external side of the substrate, through THs (through holes) and LBVHs (laser blind via holes) 49a, 49b, thereby acting as the embedded capacitors (refer to FIG. 1e).

A description will be given of a conventional second technology, referring to FIGS. 2a to 2f.

FIGS. 2a to 2f illustrate the production of a conventional PCB including a discrete type of embedded capacitors which are formed by application of a photosensitive resin. The discrete type of embedded capacitors are formed by applying a ceramic filled photosensitive resin on the PCB as disclosed in U.S. Pat. No. 6,349,456 which is granted to Motorola Inc.

In a first step, a photosensitive dielectric resin 14 containing ceramic powder is applied on a PCB 10, on which a conductive layer 12 is already formed, exposed and heat-dried (refer to FIG. 2a).

In a second step, a copper foil 16 is laminated on the dried photosensitive dielectric resin 14 (refer to FIG. 2b). In this respect, reference numeral 18 denotes a sacrificial layer which is formed by plating tin on an upper side of the copper foil 16 to be used as a copper etching resist.

In a third step, the dry film is laminated on an upper side of the sacrificial layer 18, exposed and developed to etch a portion of the sacrificial layer 18 and the copper foil 16, thereby forming upper electrodes 20 (refer to FIG. 2c).

In a fourth step, the photosensitive dielectric resin 14 positioned below the upper electrodes 20 is exposed and then etched. At this time, the upper copper electrodes 20 are used as a photomask of the photosensitive dielectric resin 14 (refer to FIG. 2d).

In a fifth step, the conductive layer 12 below the etched photosensitive dielectric resin 22 is etched to form lower electrodes 24 (refer to FIG. 2e).

In a sixth step, capacitor layers 32 of an internal layer of the PCB 10 formed through the first to fifth steps are interposed between insulating layers 26, and metal layers 30 are laminated on the resulting structure (refer to FIG. 2f).

Capacitors 32 in an internal layer of the PCB are connected to power supply terminals and grounded terminals of integrated circuit chips, mounted on an external side of the PCB through THs (through holes) and LBVHs (laser blind via holes), thereby creating the PCB including the discrete type of embedded capacitors.

A third conventional technology will be described, referring to FIGS. 3a to 3c.

FIGS. 3a to 3c illustrate the production of a conventional PCB including embedded capacitors which are formed by insertion of an additional dielectric layer having a capacitance characteristic. The additional dielectric layer having the capacitance characteristic is inserted into an internal layer of the PCB to create an embedded capacitor as a substitute of a decoupling capacitor mounted on a surface of the PCB as disclosed in U.S. Pat. Nos. 5,079,069, 5,261,153, and 5,800,575 which are granted to Sanmina Corp in the USA.

In a first step, a copper coated laminate 61, which has a high dielectric constant and is interposed between copper foils 63a, 63b, is coated with a dry film, exposed and developed to etch the copper foils 63a, 63b, thereby forming power supply electrodes of capacitors and clearances (refer to FIG. 3a).

In a second step, an internal layer 61 of the PCB subjected to the first step is interposed between insulating layers 64a, 64b and subjected to a lamination process, and external copper foils 65a, 65b are laminated on the resulting PCB (refer to FIG. 3b).

In a third step, the capacitors in the internal layer of the PCB are connected to power supply terminals and grounded terminals of integrated circuit chips 68a, 68b, mounted on an external side of the PCB, through THs (through holes) and LBVHs (laser blind via holes), thereby acting as a power distribution type of decoupling capacitor (refer to FIG. 3c). In this regard, reference numerals 67a, 67b denote clearances between the grounded and power supply electrodes. The clearances each have a predetermined width so that the copper foils do not meet with the through holes or the via holes when the through holes or the via holes are formed through the PCB.

Meanwhile, since the embedded capacitors have a structure in which the capacitors are embedded in the PCB, an area which is occupied by the chip capacitors may be reduced. Thus, the embedded capacitors are advantageous in that a mounting density of chips may increase and it is unnecessary to mount the chip capacitors on a surface of the PCB.

In conventional technologies, a long connection length between devices at a high frequency brings about occurrence of an electric parasitic load, thereby reducing the electric performances of goods. Additionally, the number of connections increases due to a solder, causing poor reliability of goods. However, a conventional embedded capacitor is advantageous in that the connection length between the devices is reduced, resulting in suppressed occurrence of the electric parasitic element. Thus, the electric performance is improved.

However, a material of the conventional embedded capacitor is, for example, a polymer or a photosensitive resin filled with ceramic. Thus, it is usefully applied to a PCB process, but has a dielectric constant too low to be used as a substitute for a chip capacitor.

Generally, capacitance depends on the area and thickness of a capacitor, and is calculated according to the following Equation 1.

$$C = \varepsilon_r \varepsilon_0 \left(\frac{A}{D}\right) \quad \text{Equation 1}$$

Wherein, $\varepsilon_r$ is the dielectric constant of a dielectric, $\varepsilon_0$ is a constant having a value of $8.855 \times 10^{-8}$, A is the surface area of the dielectric, and D is the thickness of the dielectric. The dielectric constant of the dielectric must be high in order to assure a capacitor having a high capacitance, and a smaller thickness and a larger surface area of the dielectric bring about higher capacitance of the capacitor.

A conventional bimodal polymer ceramic complex has a capacitance of 5-7 $nF/cm^2$ if the thickness is 10 µm.

For example, U.S. Pat. No. 6,274,224 granted to 3M Co. employs a thin film type composite having a thickness of 8-10 µm which includes $BaTiO_3$ ceramic powder and a thermosetting plastic epoxy or polyimide mixed with each other between copper foils used as power supply and grounded electrodes. At this time, capacitance per unit area is 10 $nF/in^2$.

Furthermore, in the third conventional technology, capacitance is low due to a low dielectric constant of an embedded capacitor layer. For instance, in a thin film type capacitor having a thickness of 10-50 µm as shown in FIG. 3a, a material employed by Sanmina Corp. is made of an FR-4 dielectric substance having a thickness of 25 µm or 50 µm between copper foils used as power supply and grounded electrodes. At this time, since the dielectric constant of FR-4 is 4-5, the capacitance per unit area is 0.5-1 $nF/in^2$ in practice.

As described above, the capacitance per unit area of the conventional embedded capacitor is 0.5-1 $nF/in^2$ or 10 $nF/in^2$, which is significantly lower than that of a traditional decoupling discrete chip capacitor, that is, 100 $nF/in^2$. Accordingly, there are many limits to the realization of the conventional embedded capacitor.

Furthermore, in the conventional technologies, a dielectric layer is laminated on a whole side of a substrate and electrodes are formed during a circuit forming process, or patterning is conducted using a photosensitive insulating layer through an exposure process. However, these procedures result in increased production costs because the formation of upper and lower electrodes, and exposure and etching processes for patterning the insulating layer are additionally carried out.

SUMMARY OF THE INVENTION

Therefore, the present invention has been made keeping in mind the above disadvantages occurring in the prior arts, and an object of the present invention is to provide a PCB including embedded capacitors, in which a dielectric layer is formed using a ceramic material having a high capacitance, thereby providing capacitors each having a high dielectric constant corresponding to the capacitance of a decoupling chip capacitor, and a method of fabricating the same.

Another object of the present invention is to provide a PCB including embedded capacitors each having a high dielectric constant and a method of fabricating the same, in which only a desired part is made of a ceramic material to form a dielectric thin film (or thick film), thereby creating the embedded capacitors. Accordingly, a loss of costly raw materials is reduced and unnecessary processes, such as a process of etching a dielectric, may be omitted, consequently, material costs are reduced and ease of production is assured.

The above objects can be accomplished by providing a PCB including embedded capacitors each having a high dielectric constant, which comprises a first insulating layer made of an insulating material to electrically insulate upper and lower parts from each other. The PCB also comprises a circuit layer made of a first conductive material, which is laminated on one side of the first insulating layer and in which circuit patterns including a plurality of lower electrodes of the embedded capacitors are formed. A plurality of second insulating layers are laminated on the lower electrodes of the circuit layer, and made of a ceramic material. A plurality of upper electrodes are laminated on the second insulating layers, and made of a second conductive material. A third insulating layer is laminated on the circuit layer and upper electrodes, and includes through holes for electrically connecting the upper electrodes to external elements.

Furthermore, the present invention provides a PCB including embedded capacitors each having a high dielectric constant, which comprises a first insulating layer made of a first insulating material to electrically insulate upper and lower parts from each other. The PCB also comprises a first circuit layer made of a first conductive material, which is laminated on one side of the first insulating layer, and in which first circuit patterns including a plurality of lower electrodes of the embedded capacitors are formed and a second insulating material is packed between the first circuit patterns. A second insulating layer is laminated on the first circuit layer, and made of a ceramic material. A second circuit layer made of a second conductive material is laminated on the second insulating layer. At this time, second circuit patterns, including a plurality of upper electrodes corresponding to the lower electrodes, are formed on the second circuit layer. A third insulating layer is laminated on the second circuit layer, and includes through holes for electrically connecting the upper electrodes to external elements.

Furthermore, the present invention provides a method of fabricating a PCB including embedded capacitors each having a high dielectric constant, which comprises a first step of forming circuit patterns including a plurality of lower electrodes of the embedded capacitors on a copper foil on one side of a copper clad laminate; a second step of laminating a mask, in which portions corresponding to the lower electrodes are opened, on the copper clad laminate to form insulating layers of the embedded capacitors, and spraying a ceramic dielectric through a thermal spray process to form ceramic films; a third step of forming upper electrodes on the ceramic films formed in the second step and subsequently removing the mask; and a fourth step of laminating the insulating layers on the copper clad laminate, on which the embedded capacitors are formed, and forming through holes for electrically connecting the upper electrodes to external elements.

Additionally, the present invention provides a method of fabricating a PCB including embedded capacitors each having a high dielectric constant, which comprises a first step of forming first circuit patterns including a plurality of lower electrodes of the embedded capacitors on a copper foil on one side of a copper clad laminate, and packing an insulating material between the first circuit patterns; a second step of spraying a ceramic dielectric on the copper clad laminate through a thermal spray process to form ceramic films; a third step of forming second circuit patterns including upper electrodes on a portion of the ceramic films, which correspond to the lower electrodes, formed in the second step; and a fourth step of laminating insulating layers on the second circuit patterns formed in the third step, and forming through holes for electrically connecting the upper electrodes to external elements.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
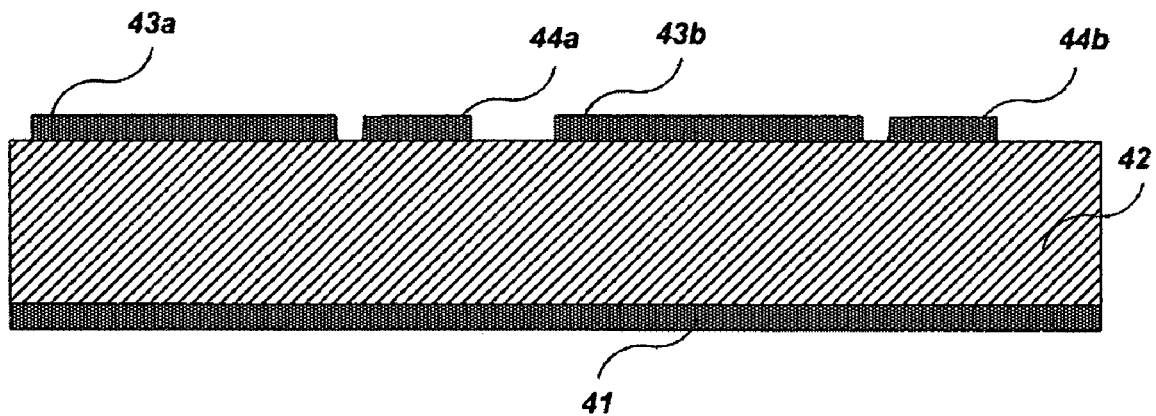
FIGS. 1a to 1e illustrate the production of a conventional PCB including the polymer thick film type of embedded capacitors.
Figure 1B:
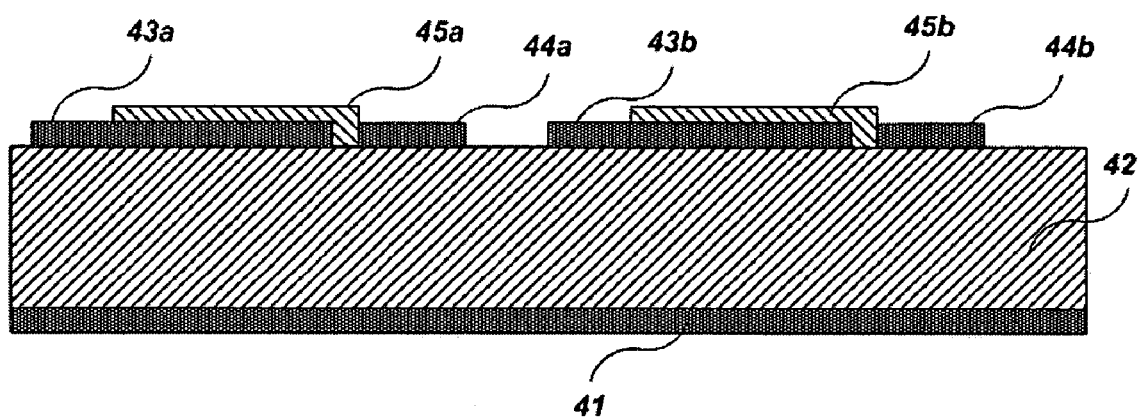
Figure 1C:
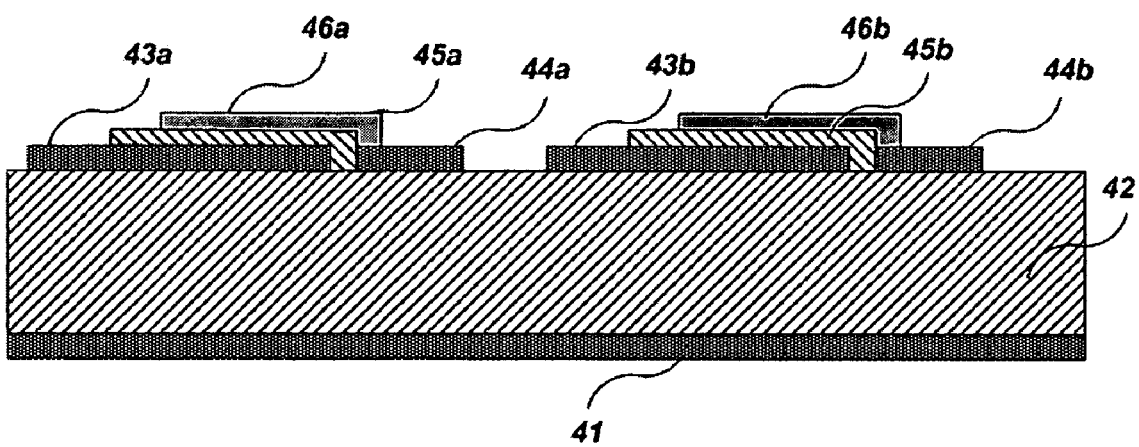
Figure 1D:
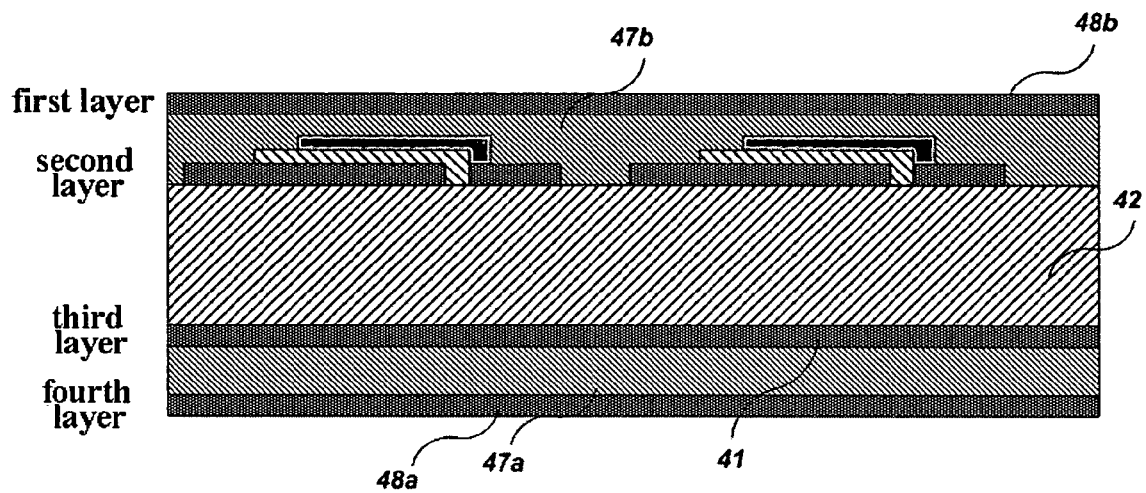
Figure 1E:
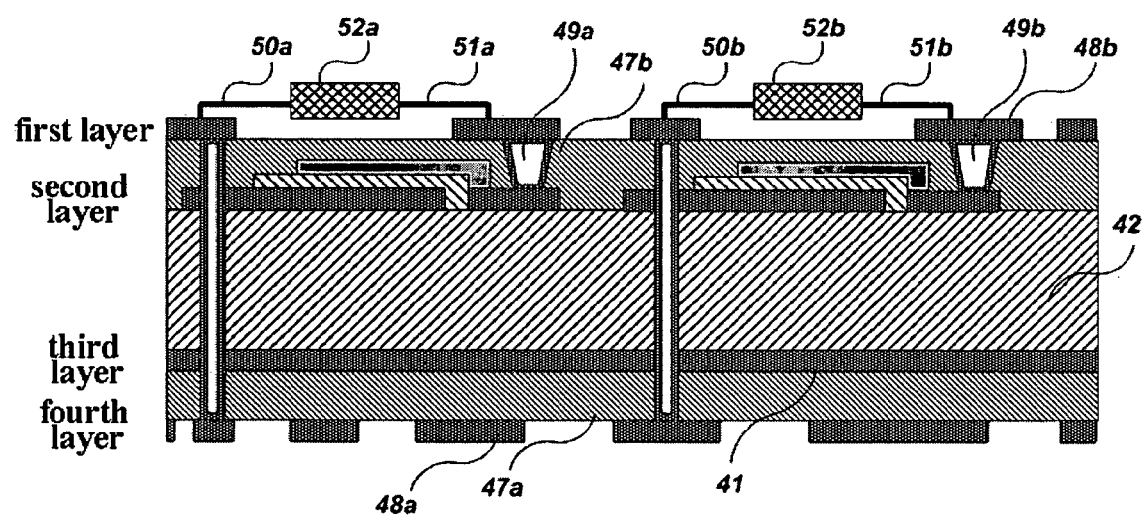
Figure 2A:
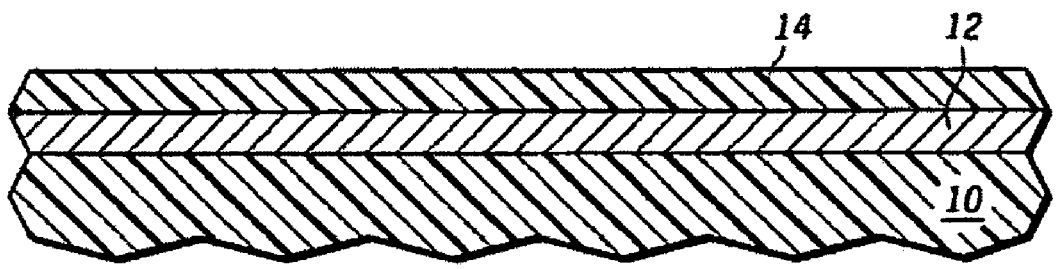
FIGS. 2a to 2f illustrate the production of a conventional PCB including the discrete type of embedded capacitors which are formed by application of a photosensitive resin.
Figure 2B:
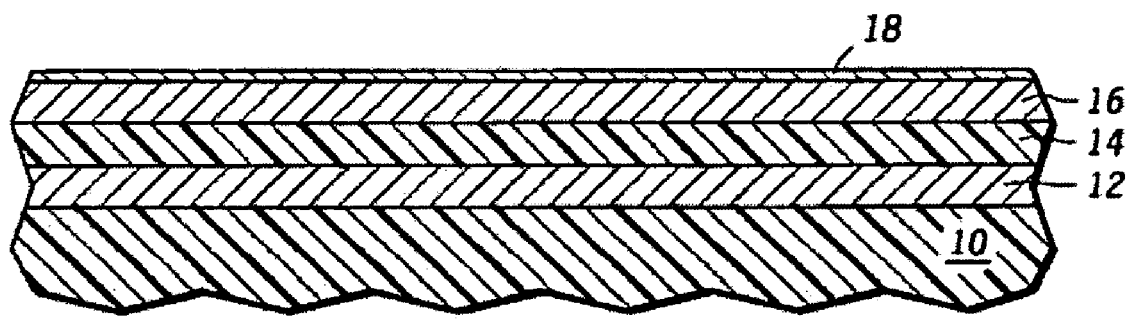
Figure 2C:
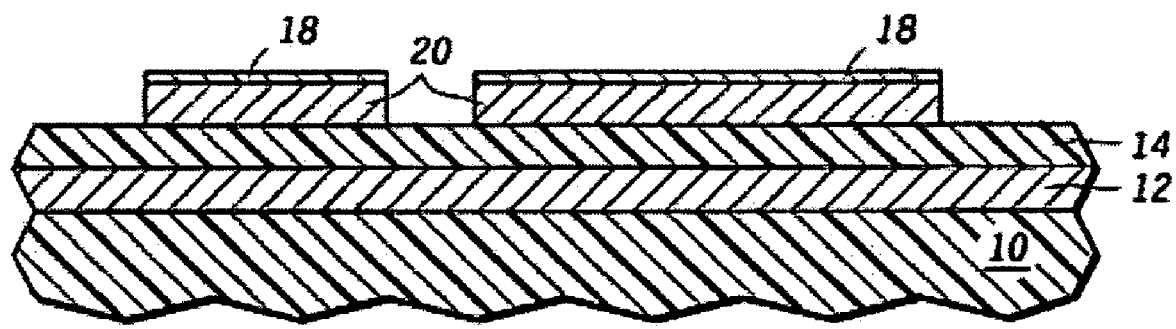
Figure 2D:
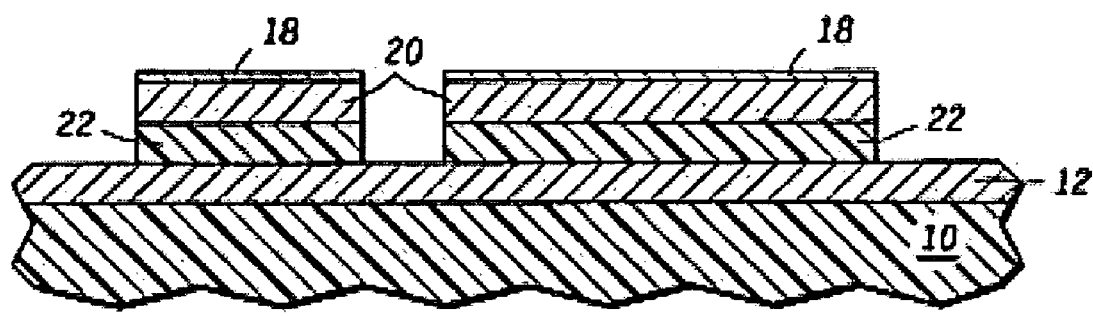
Figure 2E:
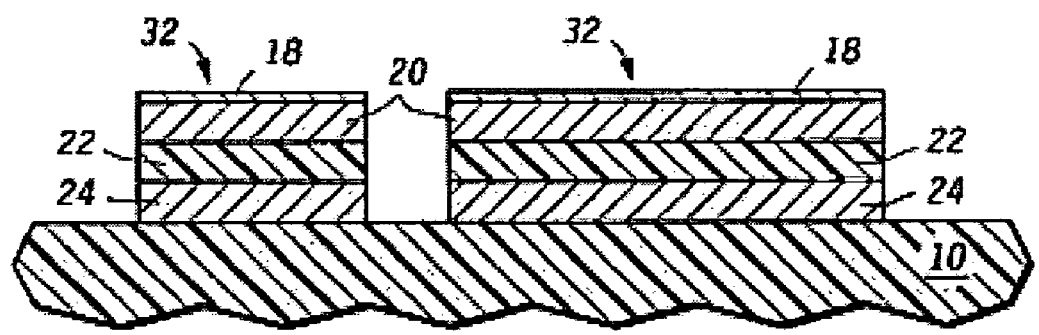
Figure 2F:
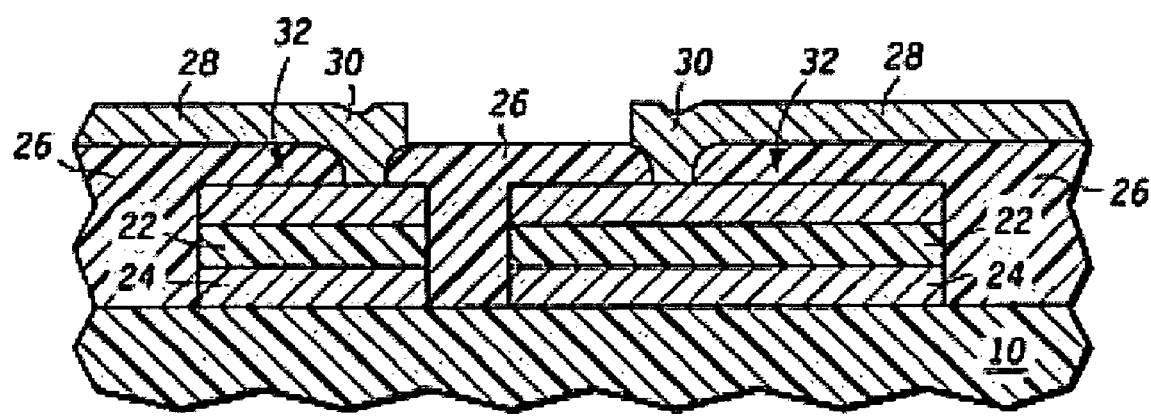
Figure 3A:
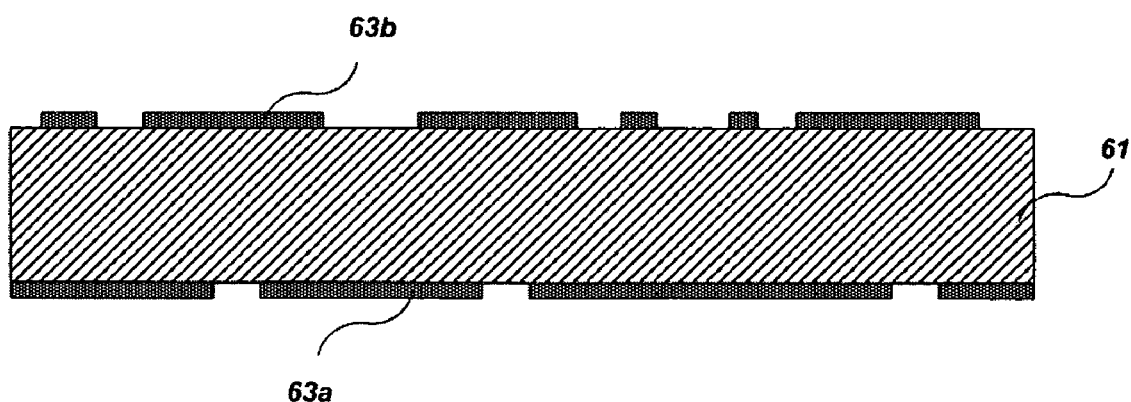
FIGS. 3a to 3c illustrate the production of a conventional PCB including embedded capacitors, which are formed by insertion of an additional dielectric layer having a capacitance characteristic.
Figure 3B:
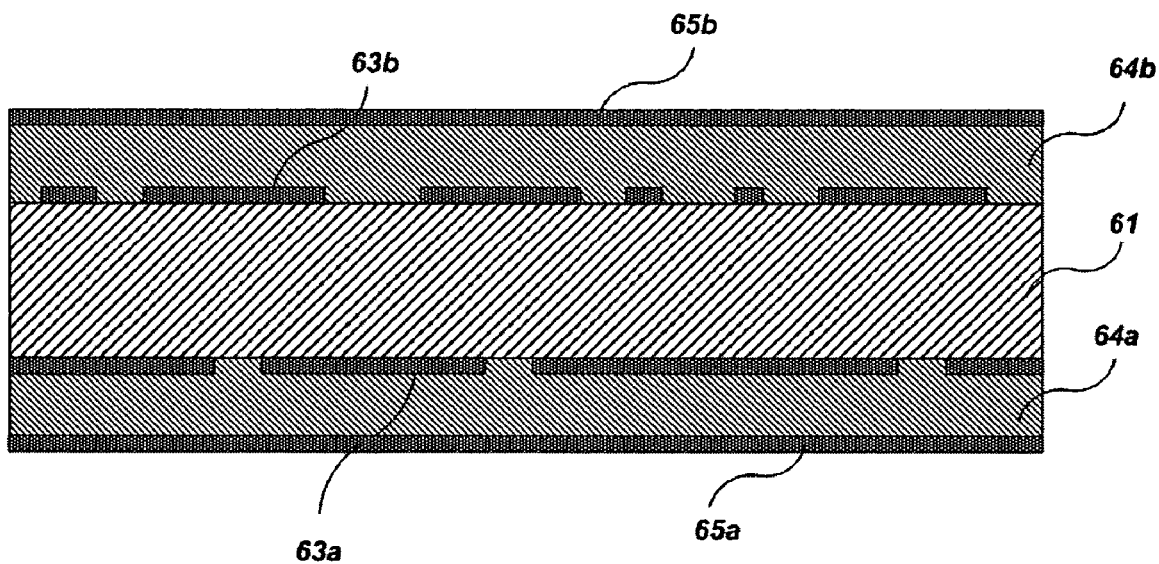
Figure 3C:
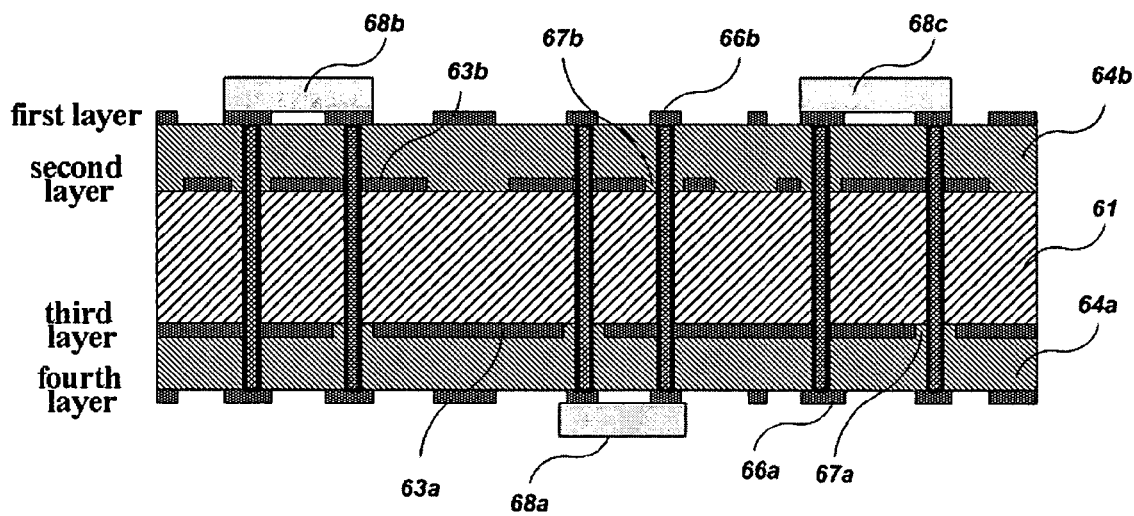

Hereinafter, a description will be given of a PCB including embedded capacitors each having a high dielectric constant and a method of fabricating the same according to the present invention, referring to the drawings.

Figure 4A:
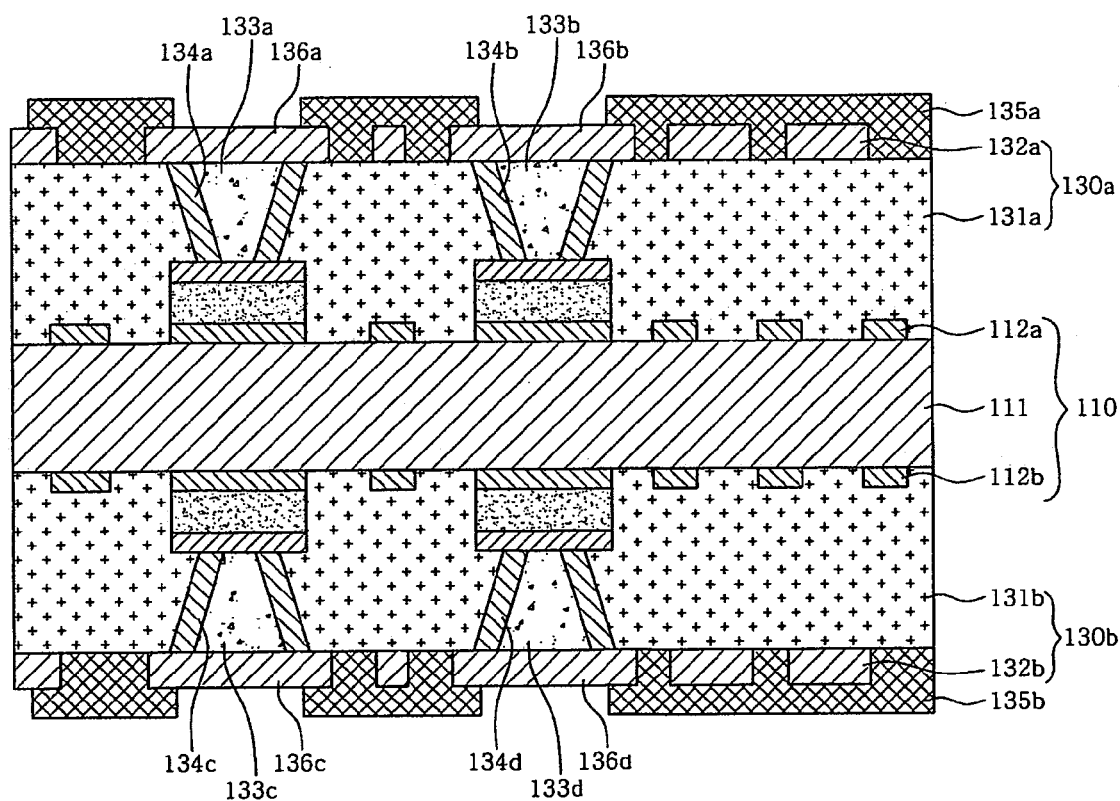
FIGS. 4a and 4b are sectional views of PCBs including embedded capacitors having high dielectric constants according to the first and second embodiments of the present invention, respectively.

FIG. 4a is a sectional view of a PCB including embedded capacitors each having a high dielectric constant according to the first embodiment of the present invention.

Referring to FIG. 4a, circuit layers 112a, 112b including patterned copper foils are formed on both sides of an insulating layer 111 constituting a core layer 110.

At this time, lower electrodes 121a, 121b, 121c, 121d of the embedded capacitors 120a, 120b, 120c, 120d are formed in the circuit layers 112a, 112b.

The embedded capacitors 120a, 120b, 120c, 120d include the lower electrodes 121a, 121b, 121c, 121d formed in the circuit layers 112a, 112b, insulating layers 122a, 122b, 122c, 122d made of ceramic materials and laminated on the lower electrodes 121a, 121b, 121c, 121d, and upper electrodes 123a, 123b, 123c, 123d laminated on the insulating layers 122a, 122b, 122c, 122d.

The embedded capacitors 120a, 120b, 120c, 120d may also include an adhesive metal layer, which consists of an adhesive metal such as Cr, Pt, or Ta, between the lower electrodes 121a, 121b, 121c, 121d, formed in the circuit layers 112a, 112b, and the insulating layers 122a, 122b, 122c, 122d so as to increase interfacial adhesion between the lower electrodes and the insulating layers. Furthermore, the embedded capacitors 120a, 120b, 120c, 120d may also include an adhesive metal layer, which consists of an adhesive metal such as Cr, Pt, Ta, between the insulating layers 122a, 122b, 122c, 122d and the upper electrodes 123a, 123b, 123c, 123d so as to increase interfacial adhesion between the insulating layers and the upper electrodes.

Insulating layers 131a, 131b are formed on the circuit layers 112a, 112b and the embedded capacitors 120a, 120b, 120c, 120d, and blind via holes 134a, 134b, 134c, 134d, for providing electrical connection between the upper electrodes 123a, 123b, 123c, 123d and external elements, are formed through the insulating layers 131a, 131b.

Resins 133a, 133b, 133c, 133d are packed into the blind via holes 134a, 134b, 134c, 134d, and nickel-gold plating layers 136a, 136b, 136c, 136d and photoresists 135a, 135b are formed outside the blind via holes 134a, 134b, 134c, 134d.

Figure 4B:
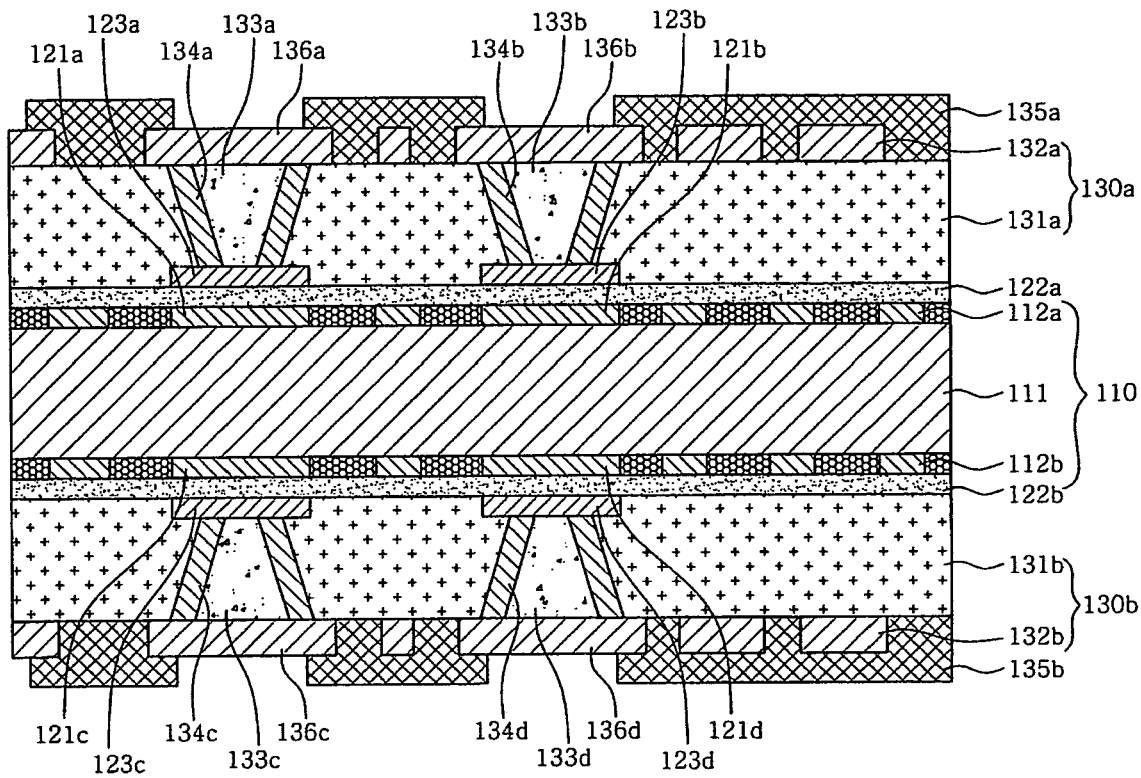

FIG. 4b is a sectional view of a PCB including embedded capacitors each having a high dielectric constant according to the second embodiment of the present invention.

Referring to FIG. 4b, circuit layers 112a, 112b including patterned copper foils are formed on both sides of an insulating layer 111 constituting a core layer 110. Insulators 113a, 113b such as resins are packed into a portion of the circuit layers 112a, 112b on which circuit patterns are not formed.

At this time, lower electrodes 121a, 121b, 121c, 121d of the embedded capacitors 120a, 120b, 120c, 120d are formed in the circuit layers 112a, 112b.

Insulating layers 122a, 122b made of ceramic materials are laminated on the circuit layers 112a, 112b.

Circuit layers 125a, 125b on which circuit patterns are formed are formed on the insulating layers 122a, 122b, and upper electrodes 123a, 123b, 123c, 123d that correspond to the lower electrodes 121a, 121b, 121c, 121d are formed on the circuit layers 125a, 125b.

Embedded capacitors 120a, 120b, 120c, 120d comprise the lower electrodes 121a, 121b, 121c, 121d formed in the circuit layers 112a, 112b, the insulating layers 122a, 122b made of ceramic materials and laminated on the circuit layers 112a, 112b, and the upper electrodes 123a, 123b, 123c, 123d formed in the circuit layers 125a, 125b laminated on the insulating layers 122a, 122b. Additionally, the embedded capacitors may also include an adhesive metal layer consisting of an adhesive metal between the lower electrodes and insulating layers, and between the insulating layers and upper electrodes so as to increase interfacial adhesion between the lower electrodes and insulating layers, and between the insulating layers and upper electrodes.

Insulating layers 131a, 131b are formed on the circuit layers 112a, 112b and embedded capacitors 120a, 120b, 120c, 120d, and blind via holes 134a, 134b, 134c, 134d, for providing electrical connection between the upper electrodes 123a, 123b, 123c, 123d and external elements, are formed through the insulating layers 131a, 131b.

Resins 133a, 133b, 133c, 133d are packed into the blind via holes 134a, 134b, 134c, 134d, and nickel-gold plating layers 136a, 136b, 136c, 136d and photoresists 135a, 135b are formed outside the blind via holes 134a, 134b, 134c, 134d.

FIGS. 5a to 5e illustrate the production of a PCB including embedded capacitors each having a high dielectric constant according to the first embodiment of the present invention.

Figure 5A:
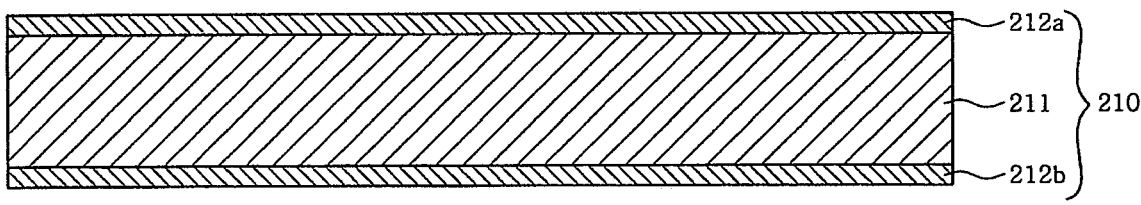
FIGS. 5a to 5e illustrate the production of a PCB including embedded capacitors each having a high dielectric constant according to the first embodiment of the present invention.

As shown in FIG. 5a, a copper clad laminate 210, which includes an insulating layer 211 and copper foils 212a, 212b formed on both sides of the insulating layer 211, is provided to fabricate a PCB including embedded capacitors each having a high dielectric constant according to the first embodiment of the present invention.

The insulating layer 211 of the copper clad laminate 210 is made of a resin. Even though the resin has excellent electrical properties, it has poor mechanical strength and its dimensional variation depending on temperature is undesirably ten times as great as metal. To avoid the disadvantages, papers, glass fibers, glass non-woven fabrics and the like are used as a reinforcing material. Use of the reinforcing material serves to increase longitudinal and transversal strengths of the resin and to reduce the dimensional variation depending on the temperature.

Generally, an electrolytic copper foil is used for the copper foils 212a, 212b. The copper foils 212a, 212b are formed in such a way that the copper foils 212a, 212b chemically react with the resin to partially penetrate into the resin in order to increase interfacial adhesion to the resin.

Figure 5B:
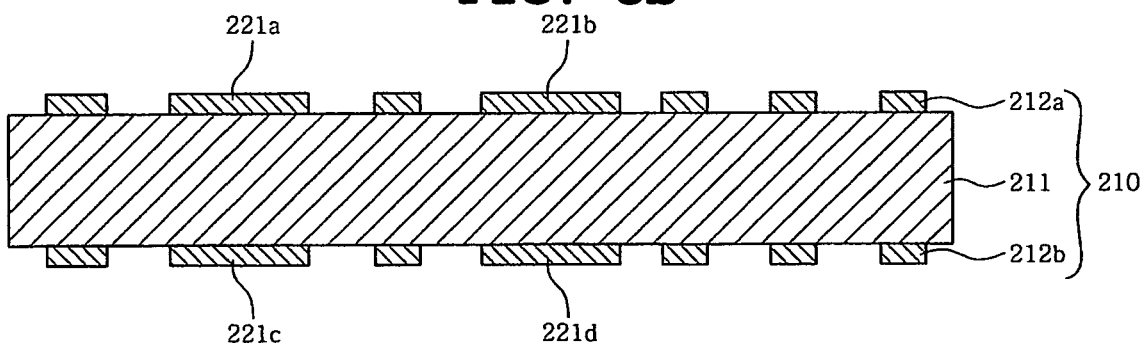

As shown in FIG. 5b, a wiring pattern is formed on the copper foils 212a, 212b according to a photolithography process. At this time, lower electrodes 221a-221d of embedded capacitors 220a-220d are formed simultaneously.

The photolithography process is conducted in the order of lamination for application of a photosensitive material, exposure, and development. The photolithography process may be classified into a photograph process and a screen printing process.

The wiring pattern is transferred onto the copper foils 212a, 212b using a photosensitizer such as D/F according to the photolithography process, and the copper foils 212a, 212b are patterned using the wiring pattern employing the photosensitizer as an etching resist. In other words, the photolithography process is conducted to form the pattern of the etching resist employing the photosensitizer on a substrate, and an etchant is sprayed on the resulting substrate to remove the copper foils other than a portion of the copper foils which is protected by the etching resist (i.e. a portion which forms the wiring pattern). The used etching resist is then stripped, thereby creating the patterned copper foils 212a, 212b.

Figure 5C:
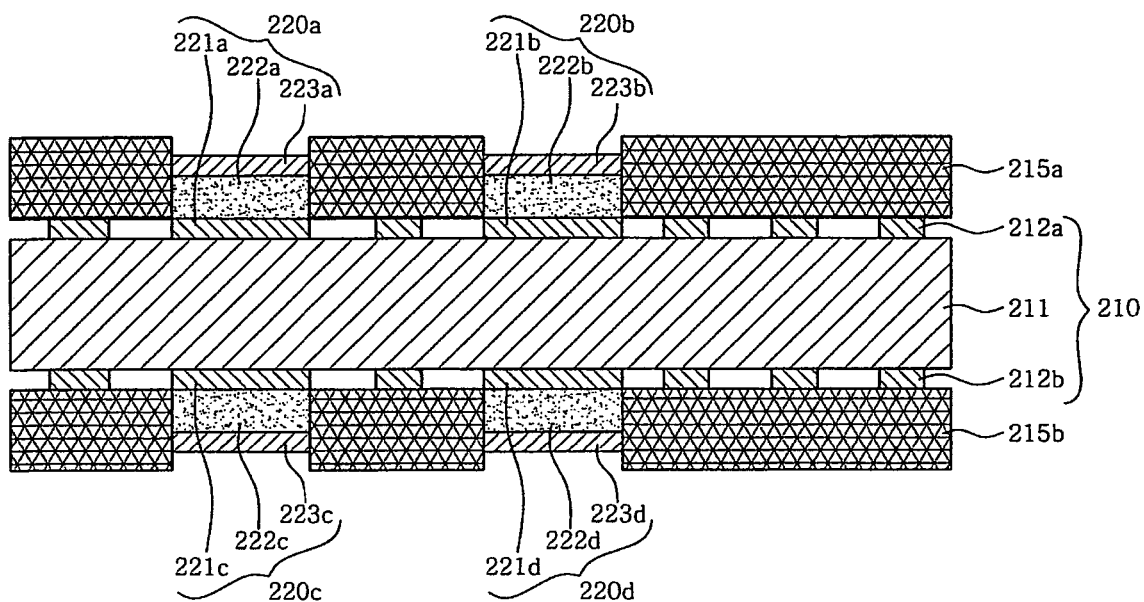

As shown in FIG. 5c, capacitor patterning masks 215a, 215b are laminated on both sides of the copper clad laminate 210 (it is possible to conduct the lamination on one side as well as on both sides) to pattern the capacitors 220a-220d. At this time, the capacitor patterning masks 215a, 215b may be made of metals, glasses, plastics or the like.

Additionally, dielectric ceramic powder is melted and sprayed onto the capacitor patterning masks 215a, 215b through a thermal spray process to form dielectric thin films (or thick films) 222a-222d of the embedded capacitors 220a-220d.

The thermal spray process is a process which includes melting nano-sized spraying material powder using a high temperature heat source, and subsequently spraying the molten powder onto a mother material in a high speed to form a thin film on the mother material.

Figure 6A:
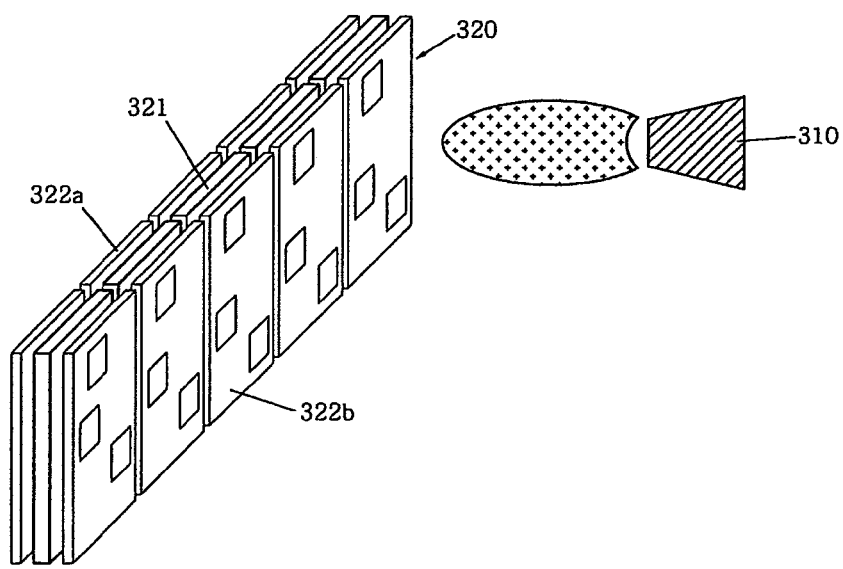
FIGS. 6a and 6b illustrate a thermal spray process adopted in the present invention.
Figure 6B:
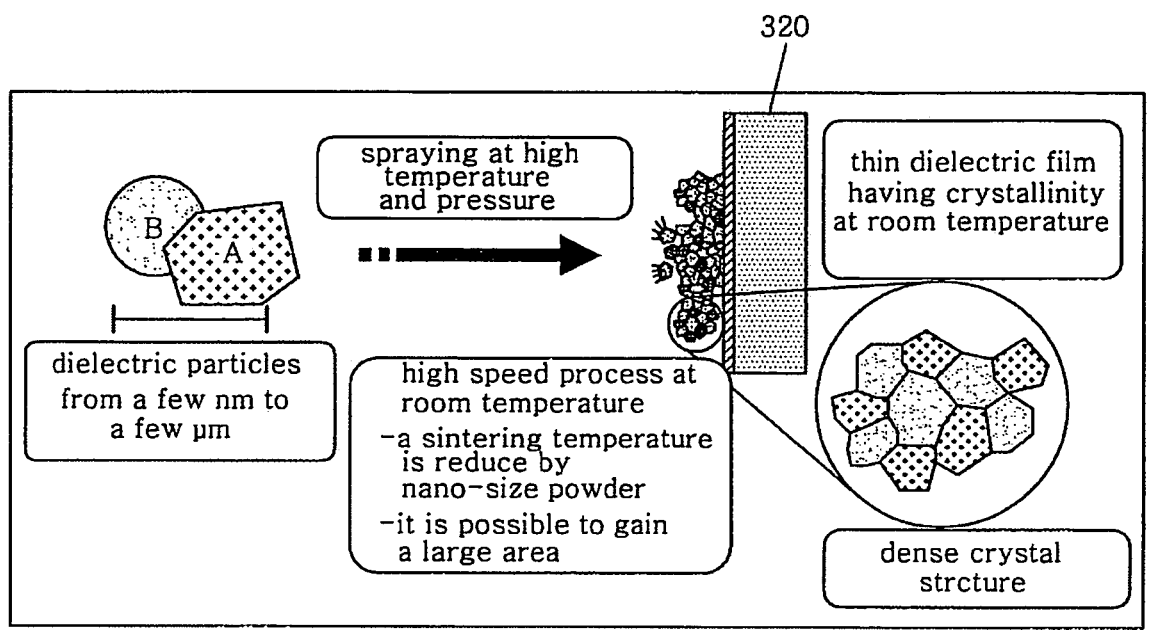

FIGS. 6a and 6b illustrate the thermal spray process adopted in the present invention.

With reference to FIG. 6a, molten nano-sized powder is sprayed using a thermal spray gun 310 to a mother material 320, in which capacitor patterning masks 322a, 322b are applied on a copper clad laminate 321, to form a thin film.

At this time, cleaning, blasting, and bond coating processes are conducted as a pretreatment process. In this regard, an adhesive metal such as Cr, Pt, or Ta may be used as a raw material in the bond coating process.

Furthermore, the spray process is conducted using the thermal spray gun 310. At this time, a distance between the gun 310 and mother material 320, and a moving speed of the gun or mother material are controlled in the spray process so as to adjust a thickness of the film. Particularly, the distance between the nozzle of the gun 310 and the mother material 320 is very important during the spray process, and depends on the type of device, the level of power, the type of spraying material, and the like.

As well, interfacial adhesion between the mother material 320 and dielectric thin film depends on the cleaning process, roughness, and chemical affinity between a surface of the mother material 320 and fused thin film.

For example, it is preferable that the distance between the gun 310 and mother material 320 be 3-4 inches, the moving speed of the gun 310 or mother material 320 be 1-2 m/sec, an air filter be used for the cleaning process, and the roughness be about ⅓ of a size of the nano-sized powder.

A description will be given of transformation of the nano-sized powder (ceramic powder having a high dielectric constant in the present invention) caused by the spraying of molten nano-sized powder onto the mother material 320 using the thermal spray gun 310, referring to FIG. 6b.

Dielectric particles from a few µm to a few µm (ceramic powder) are melted in the thermal spray gun 310, and then sprayed onto the mother material 320 at high temperature and pressure.

The molten dielectric particles adhere to the mother material 320, and are exposed to room temperature, resulting in sintered crystalline dielectric thin films 222a-222d.

At this time, examples of material for the dielectric ceramic powder include $SrTiO_3$, $BaTiO_3$, $(Ba, Sr)TiO_3$, $Pb(Zr, Ti)O_3$, $(Pb, La)(Zr, Ti)O_3$, $Pb(Ti_{1/3}Nb_{2/3})O_3$, $Ta_2O_5$, and $Al_2O_3$.

Meanwhile, after the dielectric thin films 222a-222d are formed on the lower electrodes 221a-221d according to the thermal spray process, upper electrodes 223a-223d are formed according to the thermal spray process.

At this time, the cleaning, blasting, and bond coating processes are conducted as a pretreatment process so as to improve an interfacial adhesion between the dielectric thin films 222a-222d and upper electrodes 223a-223d. In this regard, an adhesive metal such as Cr, Pt, and Ta may be used as a raw material in the bond coating process.

At this time, the upper electrodes 223a-223d may be formed through electroless and electrolytic copper plating processes instead of the thermal spray process.

An electroless plating process is the only plating process that provides conductivity to the surface of an insulator such as resins, ceramics, and glasses.

Since the electroless copper plating process is a process of plating an insulator, it is difficult to expect a reaction caused by ions with electricity. The electroless copper plating process is achieved by a deposition reaction, and the deposition reaction is promoted by a catalyst.

After the electroless copper plating process is conducted to provide the conductivity, the electrolytic copper plating process is carried out using electrolysis. The electrolytic copper plating process is advantageous in that it is easy to form a thick plating film and physical properties of an electrolytic copper-plating layer are superior to those of an electroless copper-plating layer.

Figure 5D:
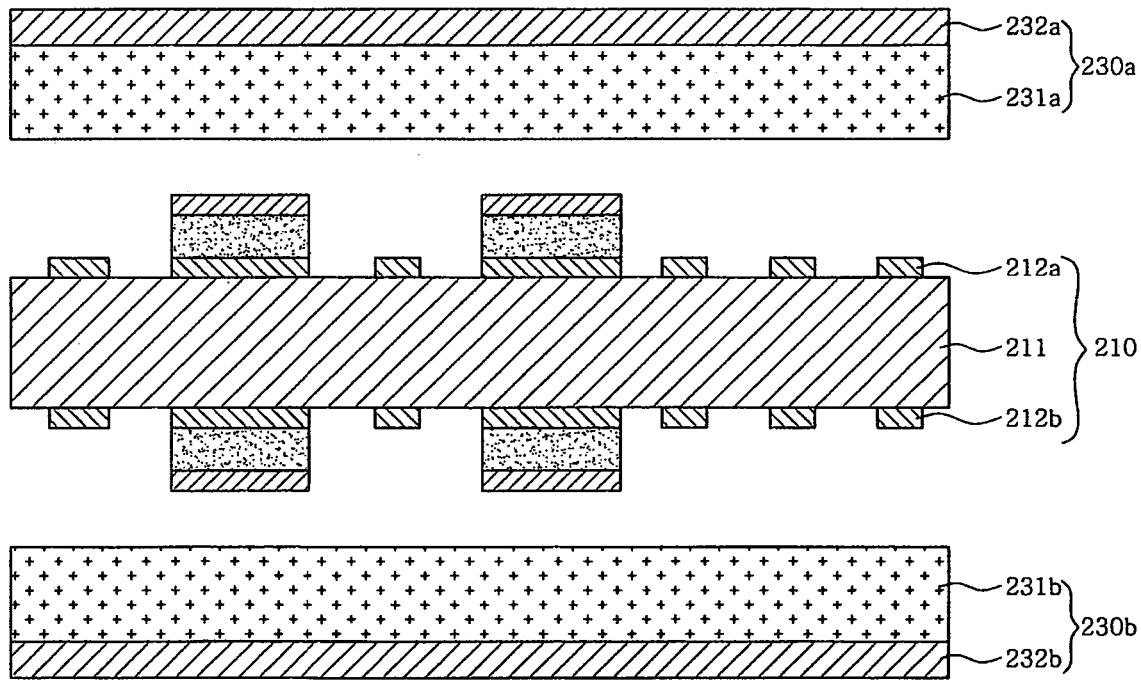

Referring to FIG. 5d, after the embedded capacitors 220a-220d are formed on the copper clad laminate 210, the masks 215a, 215b are removed.

Furthermore, RCCs 230a, 230b, in which copper foils 232a, 232b are each formed on one side of each insulating layer 231a, 231b, are laminated on both sides of the resulting copper clad laminate.

Figure 5E:
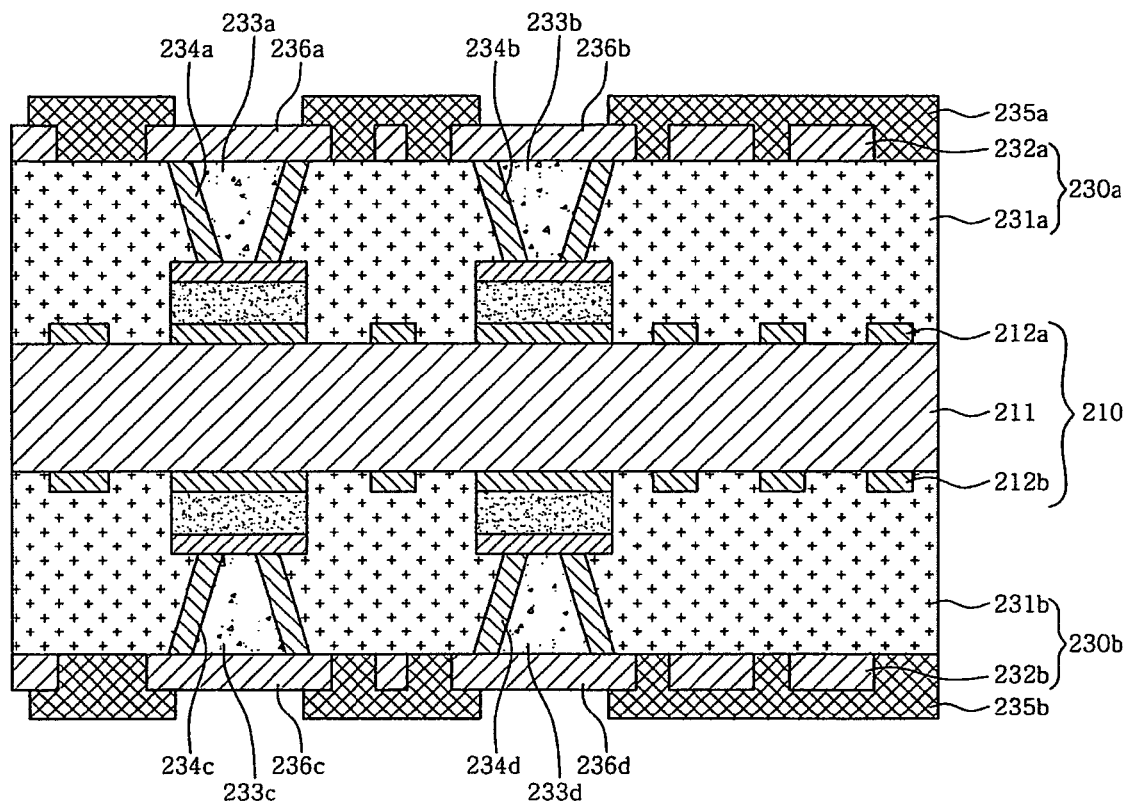

Referring to FIG. 5e, via holes 233a-233d and copper plating layers 234a-234d are formed to provide conductivity to the upper electrodes 223a-223d.

Additionally, circuit patterns are formed on the copper foils 232a, 232b, solder resists 235a, 235b are formed, and nickel-gold plating layers 236a-236d are formed to increase the conductivity of the via holes 233a-233d.

FIGS. 7a to 7f illustrate the production of a PCB including embedded capacitors each having a high dielectric constant according to the second embodiment of the present invention.

Figure 7A:
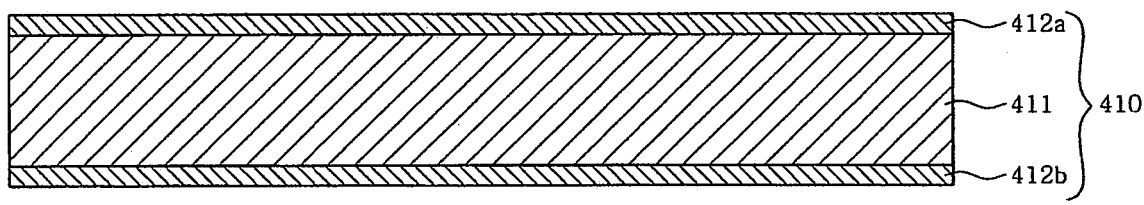
FIGS. 7a to 7f illustrate the production of a PCB including embedded capacitors each having a high dielectric constant according to the second embodiment of the present invention.

As shown in FIG. 7a, a copper clad laminate 410, which includes an insulating layer 411 and copper foils 412a, 412b formed on both sides of the insulating layer 411, is provided to fabricate the PCB including embedded capacitors each having a high dielectric constant according to the second embodiment of the present invention.

Figure 7B:
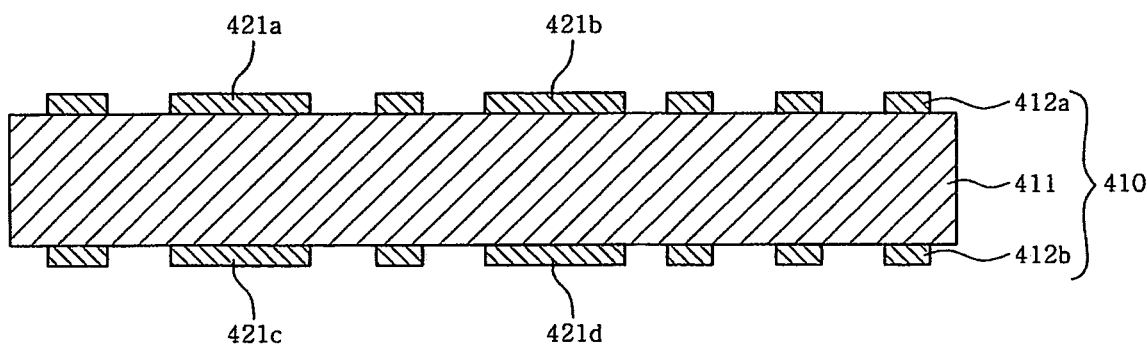

As shown in FIG. 7b, a wiring pattern is formed on the copper foils 412a, 412b according to a photolithography process. At this time, lower electrodes 421a-421d of embedded capacitors 420a-420d are formed simultaneously.

Figure 7C:
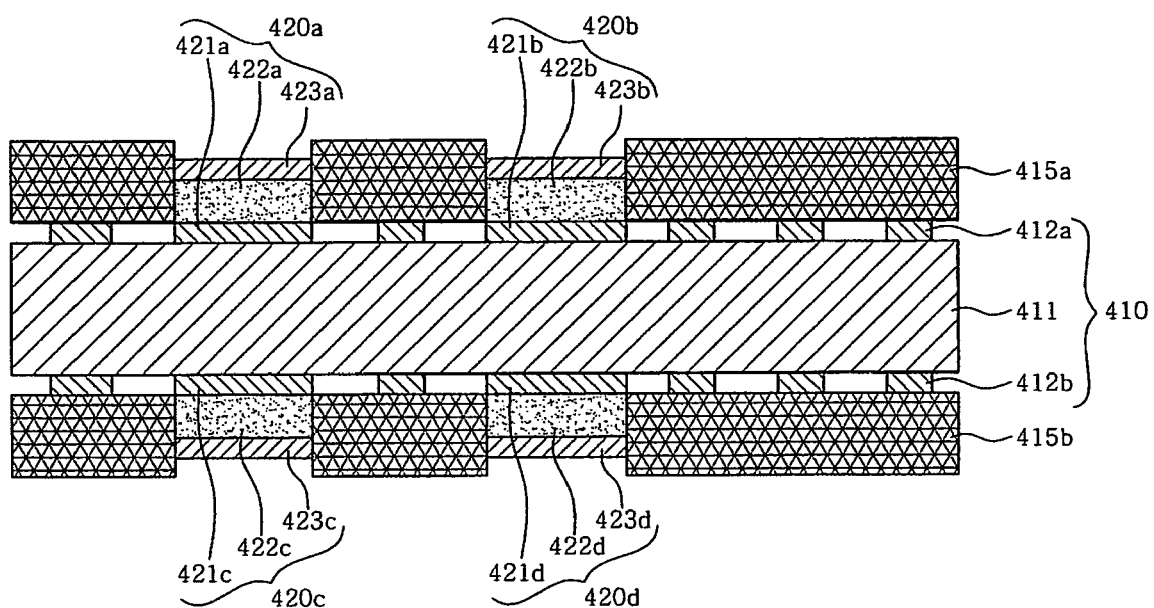

As shown in FIG. 7c, capacitor patterning masks 415a, 415b are laminated on both sides of the copper clad laminate 410 (it is possible to conduct the lamination on one side as well as on both sides) to pattern the capacitors 420a-420d. At this time, the capacitor patterning masks 415a, 415b may be made of metals, glasses, plastics or the like.

Additionally, dielectric ceramic powder is melted and sprayed onto the capacitor patterning masks 415a, 415b through a thermal spray process to form dielectric thin films (or thick films) 422a-422d of the embedded capacitors 420a-420d.

At this time, cleaning, blasting, and bond coating processes are conducted as pretreatment processes. In this regard, an adhesive metal such as Cr, Pt, and Ta may be used as a raw material in the bond coating process.

Furthermore, examples of material for the dielectric ceramic powder include $SrTiO_3$, $BaTiO_3$, $(Ba, Sr)TiO_3$, $Pb(Zr, Ti)O_3$, $(Pb, La)(Zr, Ti)O_3$, $Pb(Ti_{1/3}Nb_{2/3})O_3$, $Ta_2O_5$, and $Al_2O_3$.

Meanwhile, after the dielectric thin films 422a-422d are formed on the lower electrodes 421a-421d by the thermal spray process, upper electrodes 423a-423d are formed according to the thermal spray process.

At this time, the cleaning, blasting, and bond coating processes are conducted as a pretreatment process so as to improve an interfacial adhesion between the dielectric thin films 422a-422d and upper electrodes 423a-423d. In this regard, an adhesive metal such as Cr, Pt, or Ta may be used as a raw material in the bond coating process.

At this time, the upper electrodes 423a-423d may be formed through electroless and electrolytic copper plating processes instead of the thermal spray process.

Figure 7D:
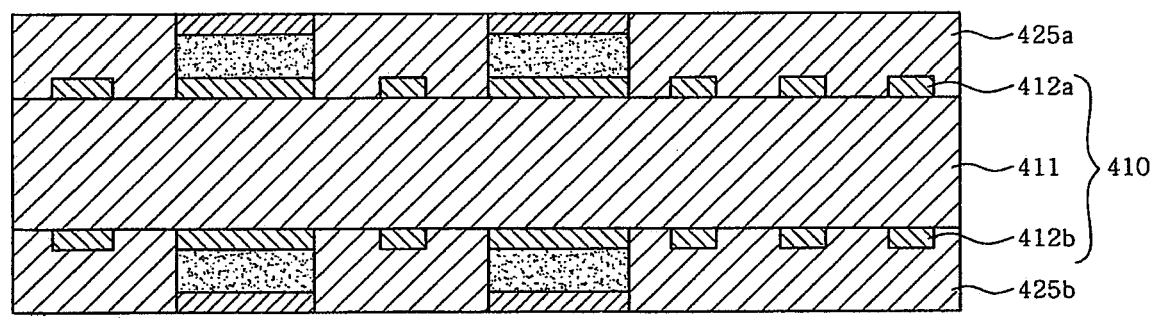

Referring to FIG. 7d, after the embedded capacitors 420a-420d are formed on the copper clad laminate 410, the masks 415a, 415b are removed.

Furthermore, resins 425a, 425b are uniformly applied on the copper clad laminate using a vacuum printing process unlike the first embodiment. This functions to prevent some problems that occur in the first embodiment, that is to say, generation of cracks caused by a bias of forces applied to the embedded capacitors 420a-420d due to a stress partially occurring in the lamination of the RCCs, or generation of pore defects or voids caused by the lamination of the B-stage RCCs disturbing the packing of the resin into edge portions of corners of the embedded capacitors 420a-420d.

Figure 7E:
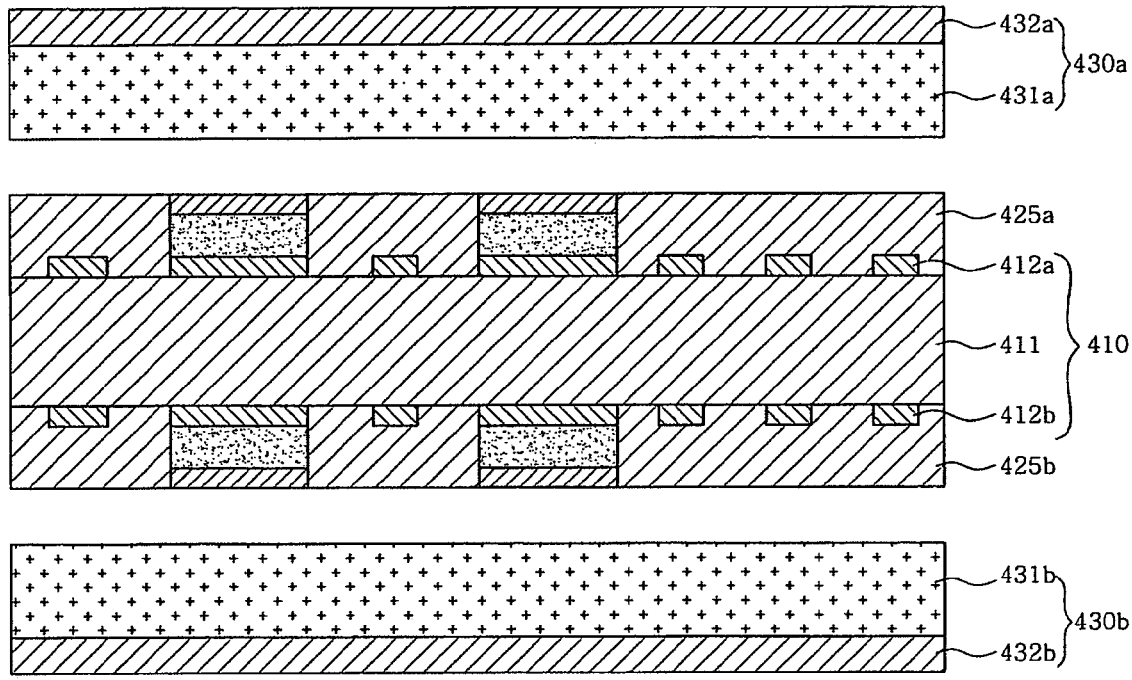

Referring to FIG. 7e, RCCs 430a, 430b, in which copper foils 432a, 432b are each formed on one side of each insulating layer 431a, 431b, are laminated on both sides of the resulting copper clad laminate.

Figure 7F:
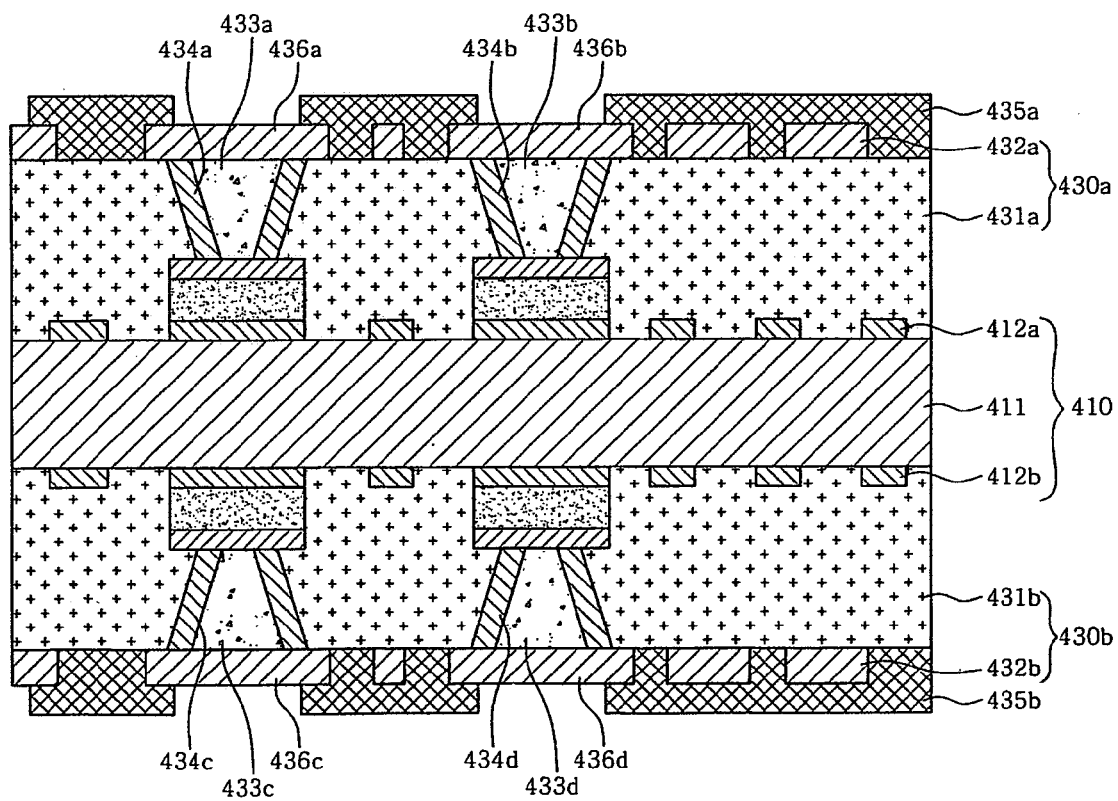

Referring to FIG. 7f, via holes 433a-433d and copper plating layers 434a-434d are formed to provide conductivity to the upper electrodes 423a-423d.

Additionally, circuit patterns are formed on the copper foils 432a, 432b, solder resists 435a, 435b are formed, and nickel-gold plating layers 436a-436d are formed to increase the conductivity of the via holes 433a-433d.

FIGS. 8a to 8f illustrate the production of a PCB including embedded capacitors each having a high dielectric constant according to the third embodiment of the present invention.

Figure 8A:
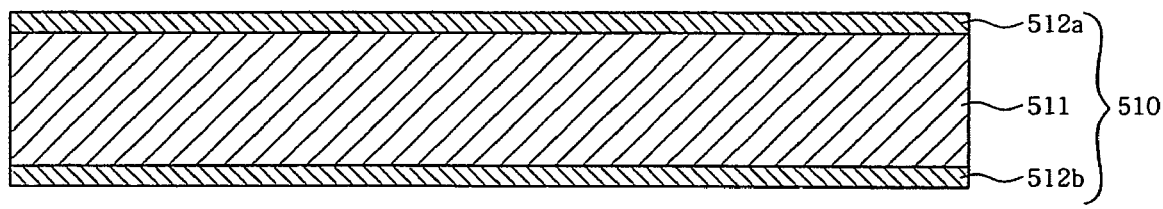
FIGS. 8a to 8f illustrate the production of a PCB including embedded capacitors each having a high dielectric constant according to the third embodiment of the present invention.

As shown in FIG. 8a, a copper clad laminate 510, which includes an insulating layer 511 and copper foils 512a, 512b formed on both sides of the insulating layer 511, is provided to fabricate a PCB including embedded capacitors each having a high dielectric constant according to the third embodiment of the present invention.

Figure 8B:
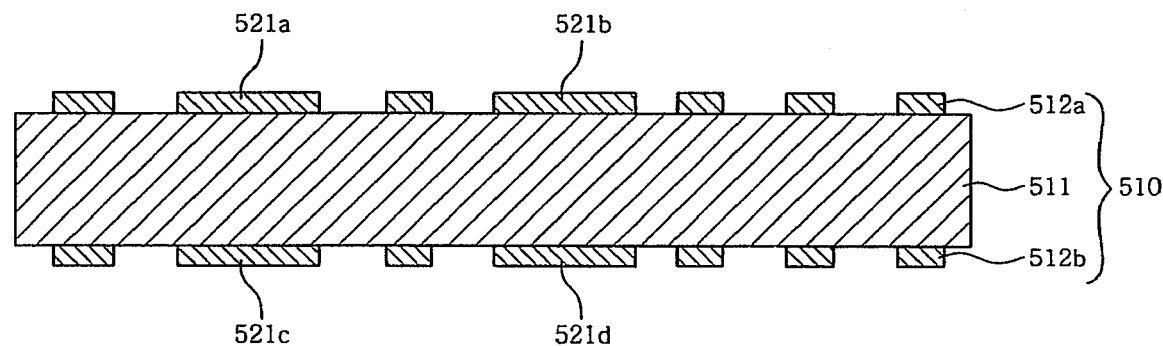

As shown in FIG. 8b, a wiring pattern is formed on the copper foils 512a, 512b according to a photolithography process. At this time, lower electrodes 521a-521d of embedded capacitors 520a-520d are formed simultaneously.

Figure 8C:
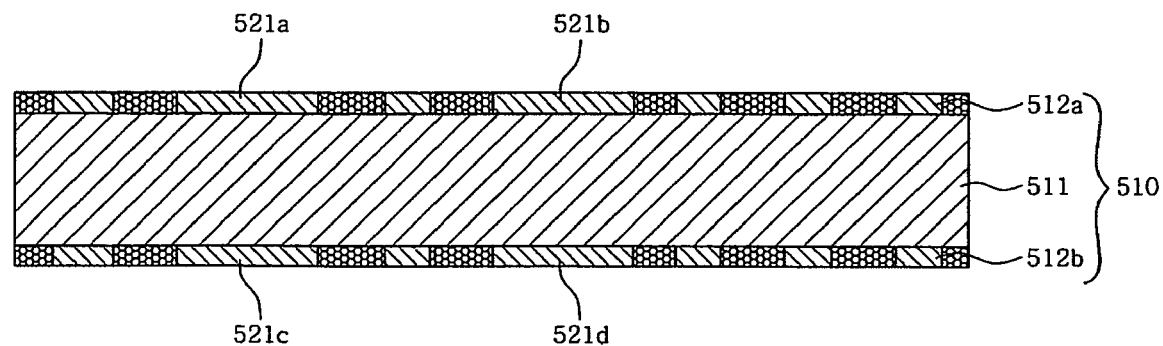

As shown in FIG. 8c, resins 515a, 515b are formed on the copper clad laminate 510, on which circuits are formed, according to a vacuum printing process. Flattening the resins 515a, 515b increases their interfacial adhesion to a ceramic material.

Figure 8D:
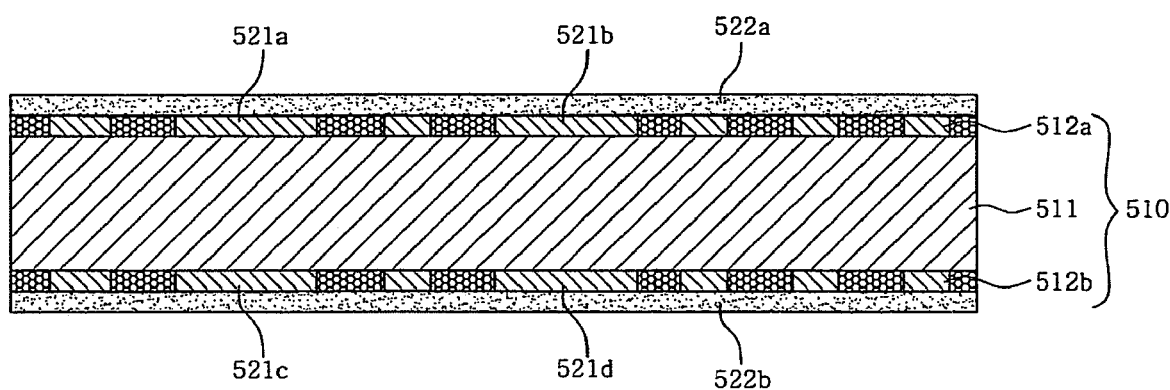
Figure 8E:
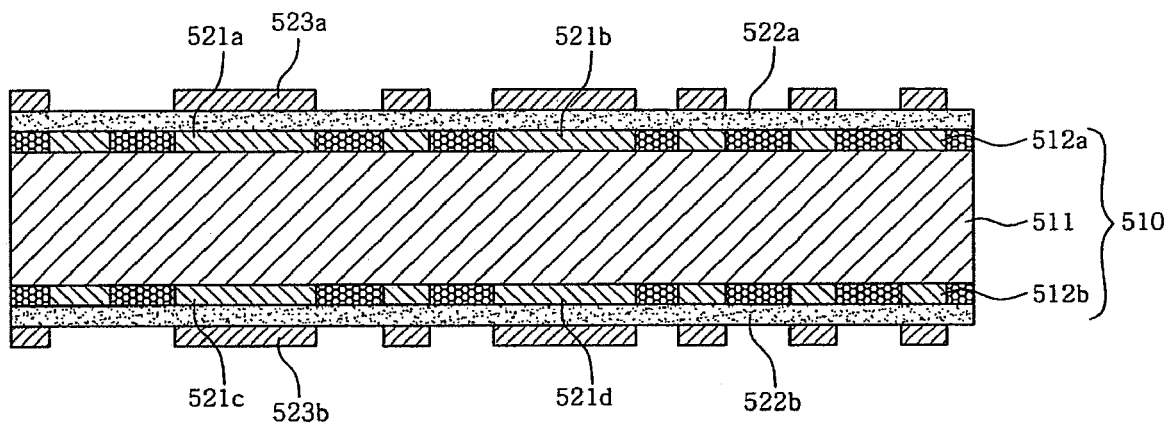

Referring to FIG. 8d, dielectric ceramic powder is melted and sprayed onto the copper clad laminate 510 as a mother material through a thermal spray process without using a mask to form dielectric thin films (or thick films) 522a, 522b of the embedded capacitors 520a-520d, unlike the first and second embodiments of the present invention.

At this time, cleaning, blasting, and bond coating processes are conducted as pretreatment processes. In this regard, an adhesive metal such as Cr, Pt, or Ta may be used as a raw material in the bond coating process.

Furthermore, examples of material for the dielectric ceramic powder include $SrTiO_3$, $BaTiO_3$, $(Ba, Sr)TiO_3$, $Pb(Zr, Ti)O_3$, $(Pb, La)(Zr, Ti)O_3$, $Pb(Ti_{1/3}Nb_{2/3})O_3$, $Ta_2O_5$, and $Al_2O_3$.

Meanwhile, after the dielectric thin films 522a, 522b are formed on the lower electrodes 521a-521d according to the thermal spray process, circuit layers 525a, 525b are formed using the thermal spray process and then patterned to form upper electrodes 523a-523d.

At this time, the cleaning, blasting, and bond coating processes are conducted as a pretreatment process so as to improve interfacial adhesion between the dielectric thin films 522a, 522b and upper electrodes 523a-523d. In this regard, an adhesive metal such as Cr, Pt, and Ta may be used as a raw material in the bond coating process.

At this time, the upper electrodes 523a-523d may be formed through electroless and electrolytic copper plating processes instead of the thermal spray process.

Figure 8F:
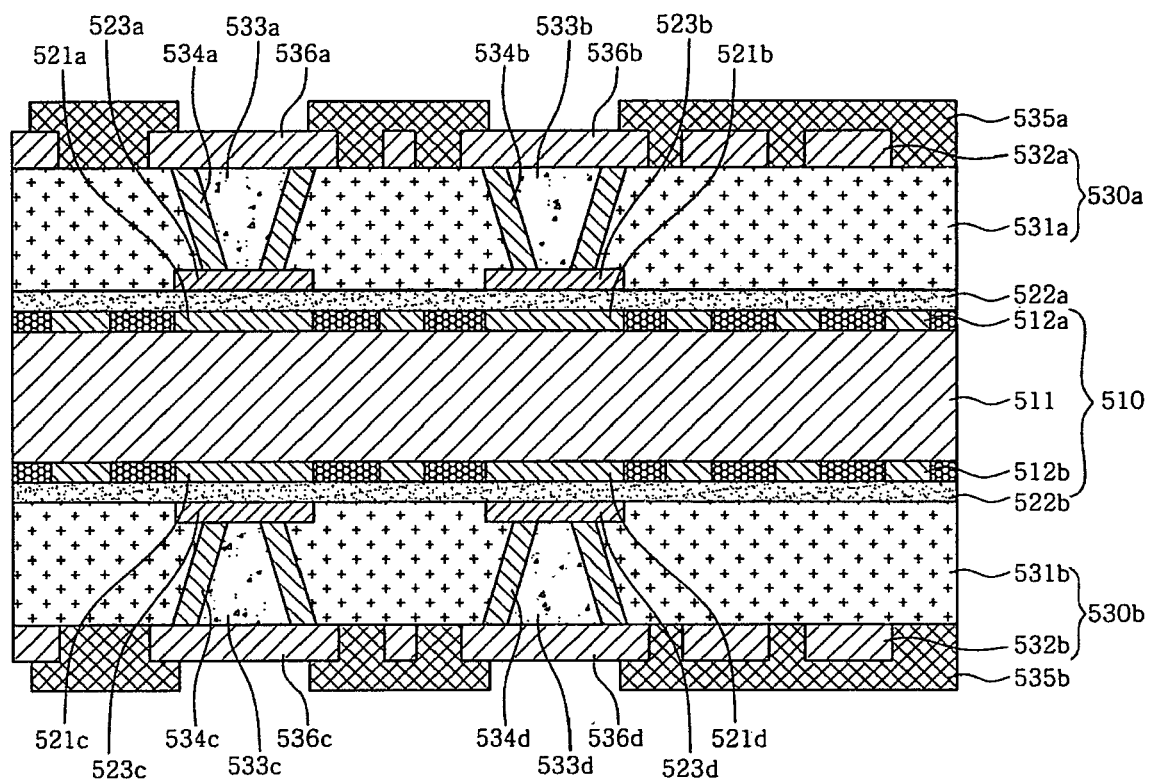

Referring to FIG. 8f, RCCs 530a, 530b, in which copper foils 532a, 532b are each formed on one side of each insulating layer 531a, 531b, are laminated on both sides of the resulting copper clad laminate.

Furthermore, via holes 533a-533d and copper plating layers 534a-534d are formed to provide conductivity to the upper electrodes 523a-523d.

Additionally, circuit patterns are formed on the copper foils 532a, 532b, solder resists 535a, 535b are formed, and nickel-gold plating layers 536a-536d are formed to increase the conductivity of the via holes 533a-533d.

As described above, the present invention provides a PCB including embedded capacitors and a method of fabricating the same, in which a paste is packed only in a desired part to create the embedded capacitors. Accordingly, a loss of costly raw materials is reduced and unnecessary processes, such as an etching process of a dielectric, may be omitted, and thus, material costs are reduced and ease of production is assured.

Furthermore, the present invention provides a PCB including embedded capacitors and a method of fabricating the same, in which precise capacitances of capacitors having a consistent height and area are assured by use of via holes formed through a FR-4 copper clad laminate.

Additionally, the present invention provides a PCB including embedded capacitors and a method of fabricating the same, in which the circuits and embedded capacitors can be simultaneously formed in a commonly used PCB layer without the use of additional PCB layers for forming capacitors.

What is claimed is:

1. A printed circuit board including an embedded capacitor having a high dielectric constant, comprising:
   a first insulating layer made of an insulating material to electrically insulate upper and lower parts from each other;
   a circuit layer made of a first conductive material, which is laminated on one side of the first insulating layer and in which circuit patterns including a plurality of lower electrodes of the embedded capacitors are formed;
   a plurality of second insulating layers laminated on the lower electrodes of the circuit layer, and made of a ceramic material;

a plurality of upper electrodes laminated on the second insulating layers, and made of a second conductive material;

a third insulating layer laminated on the circuit layer and upper electrodes, and including through holes for electrically connecting the upper electrodes to external elements; and a first adhesive metal layer made of a first adhesive metal providing interfacial adhesion on a first side of each of the plurality of second insulating layers, the first adhesive metal layer being disposed between the second insulating layers and the upper electrodes.

2. The printed circuit board as set forth in claim 1, further comprising:

a second adhesive metal layer made of a second adhesive metal providing interfacial adhesion on a second side of each of the plurality of second insulating layers, the second adhesive metal layer being disposed between the second insulating layers and the circuit layer.

3. The printed circuit board as set forth in claim 1, wherein each of the second insulating layers includes at least one selected from the group consisting of $SrTiO_3$, $BaTiO_3$, $(Ba, Sr)TiO_3$, $Pb(Zr, Ti)O_3$, $(Pb, La)(Zr, Ti)O_3$, $Pb(Ti_{1/3}Nb_{2/3})O_3$, $Ta_2O_5$, and $Al_2O_3$.

4. A printed circuit board including an embedded capacitor having a high dielectric constant, comprising:

a first insulating layer made of a first insulating material to electrically insulate upper and lower parts from each other;

a first circuit layer made of a first conductive material, which is laminated on one side of the first insulating layer, and in which first circuit patterns including a plurality of lower electrodes of the embedded capacitors are formed and a second insulating material is packed between the first circuit patterns;

a second insulating layer continuously laminated on the first circuit layer, and made of a ceramic material;

a second circuit layer made of a second conductive material, which is laminated on the second insulating layer, and in which second circuit patterns, including a plurality of upper electrodes corresponding to the lower electrodes, are formed; and a third insulating layer laminated on the second circuit layer, and including through holes for electrically connecting the upper electrodes to external elements.

5. The printed circuit board as set forth in claim 4, further comprising:

a first adhesive metal layer made of a first adhesive metal between the lower electrodes of the first circuit layer and second insulating layer, and provided to improve interfacial adhesion therebetween; and a second adhesive metal layer made of a second adhesive metal between the second insulating layer and upper electrodes of the second circuit layer, and provided to improve interfacial adhesion therebetween.

6. The printed circuit board as set forth in claim 4, wherein the second insulating layer includes at least one selected from the group consisting of $SrTiO_3$, $BaTiO_3$, $(Ba, Sr)TiO_3$, $Pb(Zr, Ti)O_3$, $(Pb, La)(Zr, Ti)O_3$, $Pb(Ti_{1/3}Nb_{2/3})O_3$, $Ta_2O_5$, and $Al_2O_3$.

7. The printed circuit board as set forth in claim 2, wherein each of the second insulating layers includes at least one selected from the group consisting of $SrTiO_3$, $BaTiO_3$, $(Ba, Sr)TiO_3$, $Pb(Zr, Ti)O_3$, $(Pb, La)(Zr, Ti)O_3$, $Pb(Ti_{1/3}Nb_{2/3})O_3$, $Ta_2O_5$, and $Al_2O_3$.

8. The printed circuit board as set forth in claim 5, wherein the second insulating layer includes at least one selected from the group consisting of $SrTiO_3$, $BaTiO_3$, $(Ba, Sr)TiO_3$, $Pb(Zr, Ti)O_3$, $(Pb, La)(Zr, Ti)O_3$, $Pb(Ti_{1/3}Nb_{2/3})O_3$, $Ta_2O_5$, and $Al_2O_3$.

* * * * *